United States Patent [19]

Kishi et al.

[11] 4,451,554
[45] May 29, 1984

[54] METHOD OF FORMING THIN-FILM PATTERN

[75] Inventors: Kohhei Kishi, Nara; Hiroaki Kato; Masataka Matsuura, both of Tenri; Tomio Wada, Nara, all of Japan

[73] Assignees: Sharp Kabushiki Kaisha, Osaka; Japan Electronic Industry Development Association, Tokyo, both of Japan

[21] Appl. No.: 403,325

[22] Filed: Jul. 30, 1982

Related U.S. Application Data

[63] Continuation of Ser. No. 205,879, Nov. 10, 1980, abandoned.

[30] Foreign Application Priority Data

Nov. 9, 1979 [JP] Japan ................. 54-145760

[51] Int. Cl.$^3$ .......................... C23F 1/02; B44C 1/22; C03C 15/00; C03C 25/06
[52] U.S. Cl. ................................. 430/313; 156/650; 156/656; 156/659.1; 156/667; 427/96; 430/318
[58] Field of Search ............ 430/313, 314, 316, 318, 430/315, 329; 156/651, 656, 659.1, 667, 650; 252/79.2; 427/102, 103, 96; 338/308; 29/829, 846; 174/68.5

[56] References Cited

U.S. PATENT DOCUMENTS 3,679,949 7/1972 Uekusa et al. ............ 136/89 X
4,108,717 8/1978 Widmann .................. 430/314 X
4,232,059 11/1980 Proffitt ........................ 156/645 X
4,256,816 3/1981 Dunkleberger .......... 430/312 X

OTHER PUBLICATIONS

IEEE Journal of Solid State Circuits, vol. SC-11, No. 4, pp. 466–471, Aug. 1976, Metallization for Integrated Circuits Using a Lift-off Technique by D. W. Widmann.

Primary Examiner—William A. Powell
Attorney, Agent, or Firm—Birch, Stewart, Kolasch and Birch

[57] ABSTRACT

A method of forming a thin-film pattern such as a thin-film circuit component comprises successive formation of a first metal layer and then a photo resist layer on a substrate by the utilization of a photoetching technique. The substrate having the first metal layer and the photo resist layer on the top of the first metal layer is deposited with second metal layers which are discontinued from each other, one of the second metal layers being deposited on the top of the photo resist layer while the other of the second metal layers is deposited directly on the substrate around the first metal layer. The substrate assembly is then immersed into a solvent bath to remove the photo resist layer together with the second metal layer resting thereon and is thereafter immersed into an etchant bath to remove the first metal layer, leaving the second metal layer on the substrate.

4 Claims, 28 Drawing Figures

Fig. 1 Prior Art
Fig. 1(a)
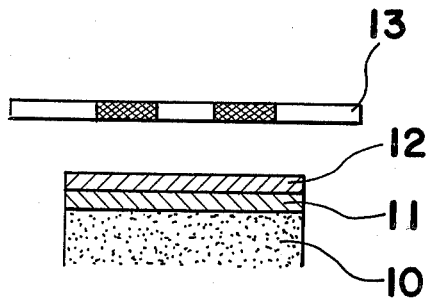
Fig. 1(b)
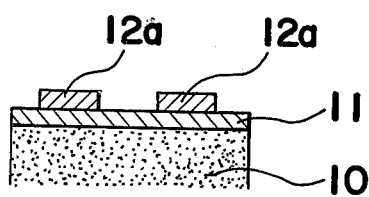
Fig. 1(c)
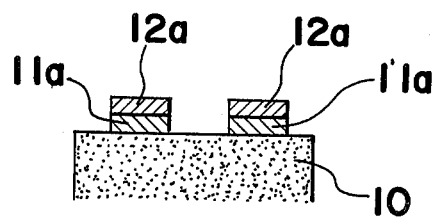
Fig. 1(d)
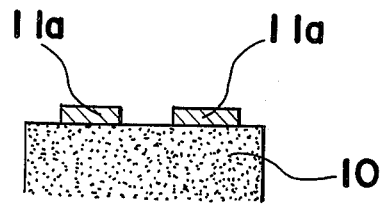
Fig. 1(e)
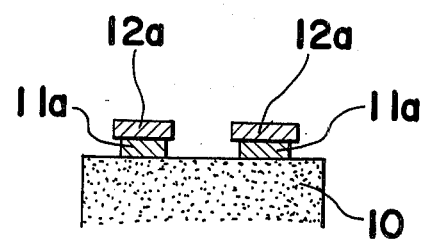
Fig. 1(f)
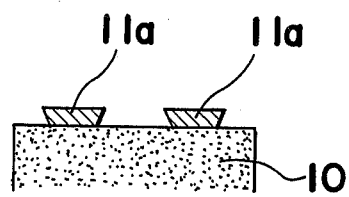
Fig. 1(g)
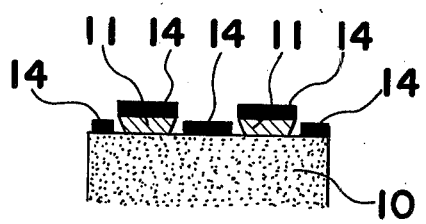

Fig. 2 Prior Art
Fig. 2(a)
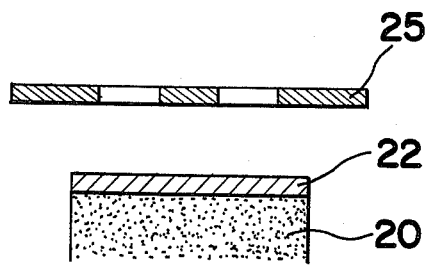
Fig. 2(b)
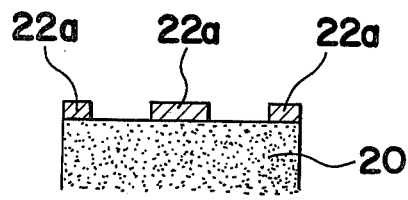
Fig. 2(c)
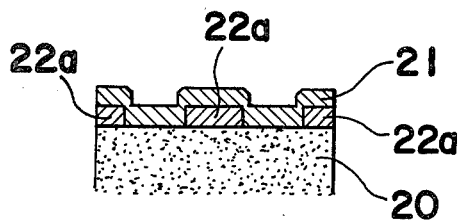
Fig. 2(d)
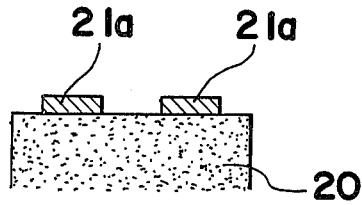
Fig. 2(e)
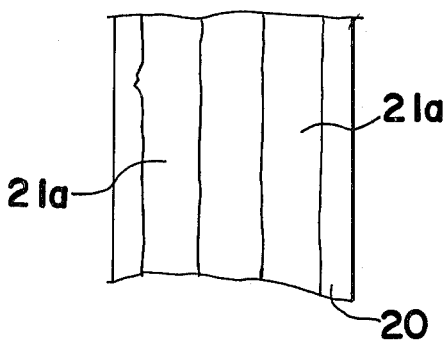
Fig. 2(f)
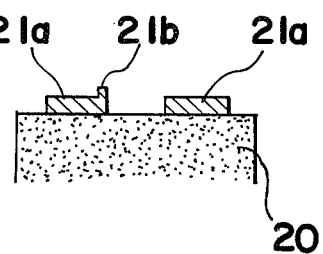

METHOD OF FORMING THIN-FILM PATTERN

This application is a continuation of copending application Ser. No. 205,879, filed on Nov. 10, 1980, now abandoned.

BACKGROUND OF THE INVENTION

The present invention generally relates to a thin-film technology and, more particularly, to a method of forming a thin-film pattern applicable in the manufacture of thin-film circuit components such as transistors, capacitors, resistors, integrated circuit wirings, solar cells and the like.

The prior art thin-film technologies utilized in the manufacture of thin-film circuit components such as listed above include a photoetching or photolithographic technique and a lift-off technique. These techniques will be discussed with reference to FIGS. 1 and 2 of the accompanying drawings, which schematically illustrate method steps of the respective techniques.

According to the prior art photoetching method shown in FIG. 1, a substrate 10 made of either glass or ceremics is coated with a metal coating 11 formed on one planar surface thereof and is then applied with a coating of photo resist material 12 over the entire surface of the metal coating 11. Then, as shown in FIG. 1(a), a patterned mask 13 having a predetermined or desired circuit pattern scribed thereon is placed over the photo resist coating 12 and exposed to light, a portion of the photo resist coating 12, which has been unexposed to light and is in complementary in shape to the pattern on the patterned mask 13, being subsequently developed to form photo resist layers 12a on the metal coating 11 as shown in FIG. 1(b). Thereafter, a portion of the metal coating 11 which is not covered by the photo resist layers 12a is etched off by immersing the substrate 10 into an etchant bath to form metal layers 11a sandwiched between the substrate 10 and the corresponding photo resist layers 12a as shown in FIG. 1(c). Finally, the photo resist layers 12a on the metal layers 11a are removed, as shown in FIG. 1(d), by the use of a photo resist remover, leaving on the substrate 10 the metal layers 11a of a shape which is a substantial replica of the predetermined or desired circuit pattern on the patterned mask 13.

The photoetching method described above involves some disadvantages. By way of example, during the etching of the metal coating 11 to remove the uncovered portions of the metal coating 11 which are not covered by the photo resist layers 12a and which would subsequently become the metal layers 11a sandwiched between the substrate 10 and the corresponding photo resist layers 12a, that uncovered portions of the metal coating 11 are also etched off to such an extent that peripheral portions of the resultant metal layers 11a are inwardly eroded to have undercuts as shown in FIG. 1(e).

Moreover, as shown in FIG. 1(f), after the removal of the photo resist layers 12a leaving the metal layers 11a on the substrate 10, the metal layers 11a tend to have a knife edge at each side edge thereof opposite to the substrate 10, and, accordingly, when and after a thin film 14 is subsequently overlaid over the metal layers 11a, the thin film 14 becomes susceptible to breakage in contact with the side edges of the metal layers 11a in a manner as shown in FIG. 1(g).

The prior art lift-off method is shown in FIG. 2. Referring to FIG. 2, a substrate 20 made of either glass or ceramics has one planar surface formed with a coating of photo resist material 22. A patterned mask 25 having a predetermined or desired circuit pattern scribed thereon is, as shown in FIG. 2(a), placed over the photo resist coating 22 and is then exposed to light, a portion of the photo resist coating 22, which has been unexposed to light and is complementary in shape to the pattern on the patterned mask 25, being subsequently developed to form photo resist layers 22a on the substrate 20 as shown in FIG. 2(b). Thereafter, as shown in FIG. 2(c), a metal is deposited on the substrate 20 to form a metal coating 21 which overlies the photo resist layers 22a. The substrate 20 with the photo resist layers 22a and the metal coating 21 is subsequently immersed into a bath containing a photo resist remover to remove the photo resist layers 22a together with that portions of the metal coating 21 which overlay the corresponding photo resist layers 22a, thereby leaving metal layers 21a on the substrate 20 as shown in FIG. 2(d).

Even the prior art lift-off method involves some disadvantages. Since the metal coating 21 is continuous contacting both of the substrate 20 and the photo resist layers 22a as shown in FIG. 2(c), the removal of the metal coating 21 over the substrate 20 tends to result in that one or more edge portions of that portion of the metal coating 21 overlaying the corresponding photo resist layers 22a are peeled off as shown in FIG. 2(e) and/or formed into unwanted fins such as shown by 21b in FIG. 2(f). These defects often results in breakage of the thin film which would be deposited on the substrate 20 overlaying the metal layers 21a in a manner similar to that shown in FIG. 1(g).

SUMMARY OF THE INVENTION

Accordingly, the present invention has been developed with a view to substantially eliminating the disadvantages inherent in the prior art method of forming a thin-film pattern which utilizes either the photoetching technique or the lift-off technique and has for its essential object to provide an improved thin-film pattern forming method which is effective to provide a thin-film circuit component less liable to breakage of a thin film deposited thereon.

Another important object of the present invention is to provide an improved thin-film pattern forming method of the type referred to above, which can be carried out economically by the use of the existing and handy equipments and tools.

According to the present invention, a first metal coating is formed on a substrate, which is in turn covered by coating of photo resist material applied over the first metal coating. A patterned mask having a predetermined or desired circuit pattern scribed thereon is placed on the photo resist coating and is then exposed to light. Subsequent to the exposure to light, a portion of the photo resist coating which has not been exposed to light is developed to form a photo resist layer resting on the first metal coating. The first metal coating is then etched off, leaving a first metal layer between the substrate and the photo resist layer.

The method so far described above is substantially identical with the photoetching method described previously with reference to FIGS. 1(a) to 1(c). However, in accordance with the present invention, a second metal is deposited on the substrate to form second metal layers on the top of the photo resist layer and on the substrate around the first metal layer, and, then, the substrate is immersed into a bath containing a solvent to dissolve the photo resist layer to remove the second metal layer resting on the photo resist layer. Thereafter, the first metal layer deposited on the substrate is etched off from the substrate by immersing it in an etchant bath, thereby leaving only the second metal layer on the substrate.

During the deposition of the second metal to form the second metal layers one on the top of the photo resist layer resting on the substrate through the first metal layer and the other directly on the substrate around the first metal layer, an undercut area around the first metal layer and below the photo resist layer resting on such first metal layer is advantageously utilized to form the second metal layers which are not continued to each other. More specifically, because the photo resist layer on the first metal layer protrudes substantially laterally of the first metal layer, that portion of the photo resist layer which protrudes beyond the first metal layer serves as an umbrella effective to cause the second metal being deposited to the discontinued second metal layers and, at the same time, to cause the second metal layer being formed directly on the substrate to assume a substantially hill-like shape.

In addition, because of the discontinuity of the second metal layers deposited respectively on the photo resist layer and the substrate, the solvent can readily penetrate into the photo resist layer during the subsequent removal of the second metal layer deposited on the photo resist layer.

Since the thin-film pattern formed by the second metal layer deposited on the substrate has no knife edge, there is no possibility that the thin film when deposited on the substrate overlaying the second metal layer on the substrate will break such as occurring in the prior art method.

BRIEF DESCRIPTION OF THE DRAWINGS

These and other objects and features of the present invention will become apparent from the following description taken in conjunction with preferred embodiments thereof with reference to the accompanying drawings, in which:

FIGS. 1(a) to 1(g) are schematic diagrams showing the sequence of method steps of the prior art photoetching process;

FIGS. 2(a) to 2(f) are schematic diagrams showing the sequence of method steps of the prior art lift-off process;

DETAILED DESCRIPTION OF THE INVENTION

Figure 3A:
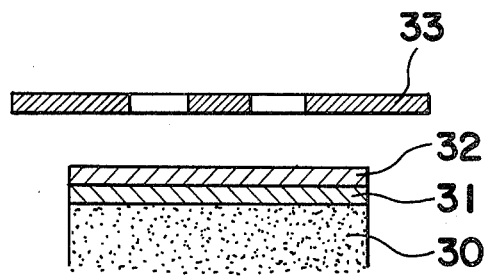
FIGS. 3(a) to 3(g) are schematic diagrams showing the sequence of method steps of the method of forming a thin-film pattern according to a first preferred embodiment of the present invention.

Before the description of the present invention proceeds, it is to be noted that like parts are designated by like reference numerals.

Referring first to FIG. 3, a substrate 30 made of, for example, glass, has one planar surface deposited with a first metal coating 31 of, for example, 2,000 Å in thickness. The first metal coating is made of either nickel (Ni) or copper (Cu) and is deposited on the substrate 30 by the use of any known vapor deposition technique. Subsequent to the deposition of the first metal coating 31, a coating 32 of photo resist material, which may be a product "Photo Resist AZ-1350" manufactured and sold by Shipley Company Inc. of U.S.A., is applied over the first metal coating 31, as shown in FIG. 3(a), by the use of a known rotary applicator driven at 2,200 rpm.

As shown in FIG. 3(a), a patterned mask 33 having a predetermined or desired circuit pattern scribed thereon is placed over the photo resist coating 32 and is then exposed to light. The substrate 30 having the coatings 31 and 32 thereon is, subsequent to the exposure to light, immersed into a developing bath containing a developer for the photo resist material "Photo Resist AZ-1350", to remove the portion of the photo resist coating 32 which has been exposed to light, leaving unexposed portions of the same photo resist coating 32 on the first metal coating 31 to provide photo resist layers 32a as shown in FIG. 3(b).

Figure 3B:
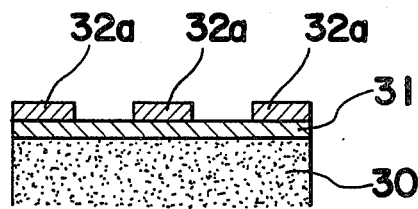
Figure 3C:
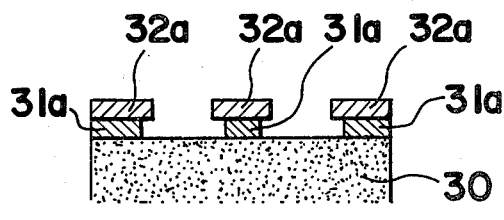

The substrate assembly shown in FIG. 3(b) is thereafter immersed into an etchant bath to remove a portion of the first metal coating 31 which is not covered by the photo resist layer 32a, thereby forming first metal layers 31a between the substrate 30 and the corresponding photo resist layers 32a as shown in FIG. 3(c). The etchant bath to be used during this etching process may contain an aqueous nitric acid solution prepared by the use of 60% concentrated nitric acid dilluted four times by water, which etchant bath is preferably heated to 40° C. When the substrate assembly of FIG. 3(b) is so immersed into the etchant bath, the etching process takes place according to the following formula.

$$Ni + 4HNO_3 \rightarrow Ni(NO_3)_2 + 2NO_2 + 2H_2O \qquad (1)$$

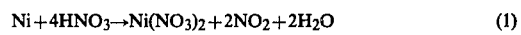

Since the method so far described is substantially identical with the conventional photoetching process, undercut areas are formed around the first metal layers 31a and below the corresponding photo resist layers 32a as best shown in FIG. 3(c), with peripheral portions of the photo resist layers 32a protruding laterally outwardly beyond the corresponding first metal layers 31a.

Figure 3D:
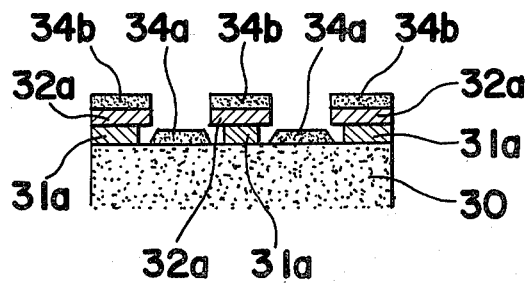

After the etching process is effected to remove the portion of the first metal coating 31 uncovered by the photo resist layers 32a, a second metal, either aluminum (Al) or tantalum (Ta), is deposited in a thickness of, for example, 1,500 Å over the substrate assembly shown in FIG. 3(c) to form discontinued second metal layers 34a and 34b, each of the second metal layers 34a being deposited directly on the substrate 30 at a position between the adjacent two first metal layers 31a while each of the second metal layers 34b are deposited on the top of the corresponding photo resist layer 32a as best shown in FIG. 3(d). This is possible because of the presence of the peripheral portions of the photo resist layers 32a protruding laterally outwards beyond the corresponding first metal layers 31a. More specifically, during the deposition of the second metal by the utilization of a vacuum deposition technique, vapors of the second metal do not reach portions of the substrate 30 around the respective first metal layers 31a and below the peripheral portions of the photo resist layers 32a, that is, the portions of the substrate 30 which are occupied by the undercut areas, while they are deposited on the top of each of the photo resist layers 32a and other portions of the substrate 30 which are aligned with respective spaces between the photo resist layers 32a.

Accordingly, the resultant second metal layers 34a and 34b are discontinued from each other as shown in FIG. 3(d) while each of the second metal layers 34a deposited on the substrate 30 is deposited in a manner as to assume a hill-shaped cross sectional representation.

It is to be noted that, in order for the thin-film pattern to be precisely formed, the vacuum deposition to form the second metal layers 34a and 34b should preferably be carried out to such an extent as to cause each of the second metal layers 34a and 34b to have a thickness smaller than the thickness of the first metal layers 31a or the first metal coating 31.

Figure 3E:
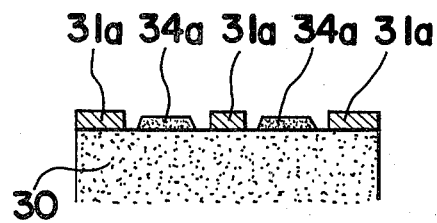

Thereafter, the substrate assembly of the construction shown in FIG. 3(d) is immersed into a bath containing a solvent, which may be either acetone or the photo resist remover for the photo resist material "Photo Resist AZ-1350" to remove the photo resist layers 32a together with the second metal layers 34b, thereby leaving only the first and second metal layers 31a and 34a on the substrate 30 as shown in FIG. 3(e). It is to be noted that, since the second metal layers 34a and 34b which are respectively deposited on the corresponding photo resist layers 32a and on the substrate 30 are discontinued from each other as hereinbefore described, the solvent effective to dissolve the photo resist layers 32a can readily penetrate into the photo resist layers 32a to dissolve the latter. By dissolving the photo resist layers 32a in this manner, the second metal layers 34b on the corresponding photo resist layers 32a can readily be removed.

Figure 3F:
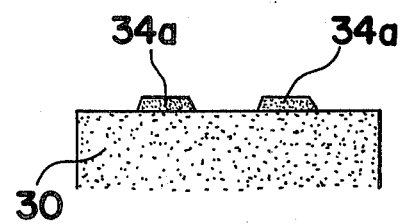

The substrate 30 having the first and second metal layers 31a and 34a as shown in FIG. 3(e) is subsequently immersed into the same etchant bath as used to form the first metal layers 31a as shown in FIG. 3(c), to remove the first metal layers 31a, thereby leaving only the second metal layers 34a on the substrate 30 as shown in FIG. 3(f). During this step, the second metal layers 34a do not dissolve in contact with the etchant since the material for the second metal layers 34a is inactive to the etchant used.

Figure 3G:
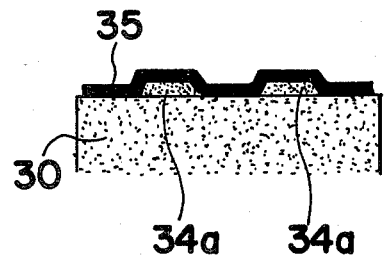

Since each of the second metal layers 34a has its side face so inclined relative to the substrate 30 as to have a substantially hill-shaped cross section as hereinbefore described, there is no possibility that a thin layer 35 which would be subsequently deposited on the substrate 30 overlaying the second metal layers 34a as shown in FIG. 3(g) will break in contact with an edge at the side face of the respective second metal layer 34a.

It is to be noted that the formula (1) described above applies where nickel is employed as a material for the first metal coating 31 or the first metal layers 31a. Where copper is employed as a material for the first metal coating 31 or the first metal layers 31a, the etching process takes place in the following manner.

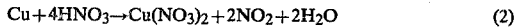

$$Cu + 4HNO_3 \rightarrow Cu(NO_3)_2 + 2NO_2 + 2H_2O \qquad (2)$$

In any event, the etchant used should be of a type capable of reacting selectively with nickel or copper, but not with aluminum and tantalum.

In the practice of the method of the present invention, the substrate 30 may have at least a portion of the planar surface thereof deposited with a transparent electrode layer of indium oxide, before it is subjected to the method of the present invention. This will now be described with reference to FIG. 4.

Figure 4:
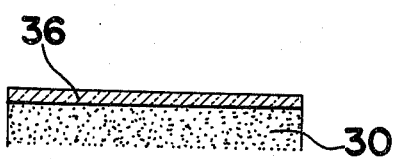
FIGS. 4(a) to 4(h) are schematic diagrams showing the sequence of method steps of the method of forming a thin-film pattern according to a second preferred embodiment of the present invention.
Figure 4:
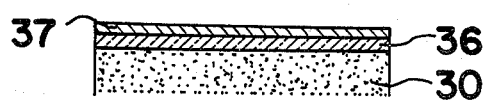
Figure 4:
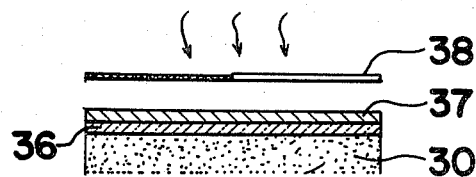
Figure 4:
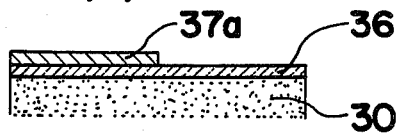
Figure 4:
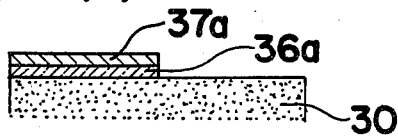
Figure 4:
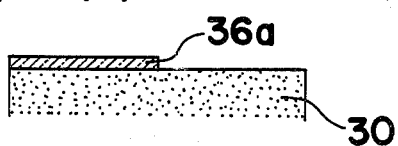
Figure 4:
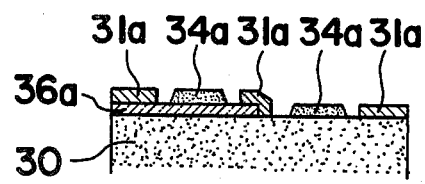
Figure 4:
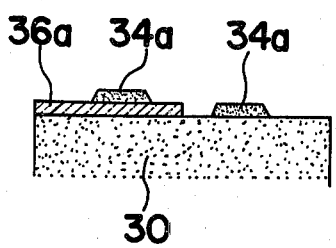

Referring to FIG. 4, the substrate 30 has its planar surface deposited with a coating 36 of indium in any known method, for example, by the utilization of a vapor deposition technique, a sputtering technique or an ion plating technique, as shown in FIG. 4(a). Subsequently, as shown in FIG. 4(b), a coating 37 of photo resist material is applied over the indium coating 36 and is then exposed to light through a mask 38 as shown in FIG. 4(c). A portion of the photo resist coating 37 which has exposed to light is dissolved, leaving an unexposed portion thereof to form a photo resist layer 37a as shown in FIG. 4(d). The substrate 30 is thereafter immersed into an etchant bath to remove a portion of the indium coating 36 which is not covered by the photo resist layer 37a, thereby forming an indium layer 36a between the photo resist layer 37a and the substrate 30 as shown in FIG. 4(e). The photo resist layer 37a resting on the indium layer 36a is then removed as shown in FIG. 4(f) to leave only the indium layer 36a on the substrate 30. The process steps shown in FIGS. 4(b) to 4(f) are carried out according to the known photoetching method.

The substrate 30 having the indium layer 36, that is, the transparent electrode layer, is subjected to the method of the present invention described with reference to FIGS. 3(a) to 3(g). It is to be noted that FIGS. 4(g) and 4(h) correspond respectively to FIGS. 3(e) and 3(f), except that the substrate 30 shown in FIG. 4 has the transparent electrode layer 36a deposited on a portion of the planar surface of the substrate 30.

It is to be noted that, during the etching process, the emission of $NO_2$ as shown in the formula (1) or (2) above does not adversely affect the characteristics, such as transmissivity and electric resistance, of the transparent conductor layer.

Although the present invention has fully been described in connection with the preferred embodiments thereof with reference to the accompanying drawings, it is to be noted that various changes and modifications are apparent to those skilled in the art. By way of example, the material for the substrate 30 may not be limited to glass and ceremics, but may include a silicon wafer. In addition, other than the vapor deposition technique, any one of a known sputtering and ion plating techniques may be employed to deposit the first metal coating 31 and the second metal layers 34a and 34b on the substrate 30.

Accordingly, such changes and modifications are to be understood as being included within the true scope of the present invention unless they depart therefrom.

What is claimed is:

1. A method suited for the manufacture of a thin-film transistor or a thin-film capacitor which comprises the steps of:
    forming a first metal coating on a surface of a substrate;
    forming a photo resist coating on the first metal coating formed on the substrate;
    exposing the photo resist coating selectively to light by the use of a patterned mask;
    developing a portion of the photo resist coating which has not been exposed to light to form in an imagewise configuration a photo resist layer resting on the first metal coating;
    immersing the substrate into a first etchant bath to remove that portion of the first metal coating which is uncovered by the photo resist layer and to produce an undercut area beneath said photo resist coating in the still covered areas, thereby leaving a first metal layer between the photo resist layer and the substrate with a portion of the photo resist layer protruding beyond the remaining portion of the first metal coating to produce an umbrella effect;

forming second metal layers to a thickness smaller than the thickness of the first metal coating on the top of the photo resist layer and also in an imagewise configuration on a portion of the substrate surface around the first metal layer in those areas from which the portion of the first metal coating was initially removed such that said second metal image configuration is discontinuous with said first metal coating beneath said photo resist and has sloping sides;

contacting the substrate with a solvent to remove the photo resist layer together with the second metal layer formed on the top thereof; and immersing the substrate into a second etchant bath to remove that portion of the first metal layer originally formed and still remaining on the substrate surface while not etching the second metal which has been deposited in an imagewise configuration.

2. The method of claim 1, wherein at least a portion of the surface of the substrate is formed with a transparent electroconductive layer, the formation of the transparent electroconductive layer taking place before the forming of the first metal coating on the surface of said substrate.

3. A method as claimed in claim 1 or 2, wherein the first metal coating is made of a metal selected from the group consisting of copper and nickel, the second metal layers are made of a metal selected from the group consisting of aluminum and tantalum, and said first etchant bath contains an aqueous solution of nitric acid.

4. The method of claim 1, further including the step of depositing a thin film thereon.

* * * * *